United States Patent [19]

Lasmayoux et al.

[11] Patent Number: 4,941,835

[45] Date of Patent: Jul. 17, 1990

[54] MACHINE-PLUGGABLE ELECTRONIC PACKAGE HAVING A MECHANICAL INTERLOCK

[75] Inventors: Casimir Lasmayoux, La Colle sur Loup; Antoine Pantani, Vence, both of France

[73] Assignee: International Business Machines Corporation, Armonk, N.Y.

[21] Appl. No.: 322,964

[22] Filed: Mar. 14, 1989

[30] Foreign Application Priority Data

Mar. 15, 1988 [FR] France .................... 88 480009

[51] Int. Cl.⁵ ........................................... H01R 13/00
[52] U.S. Cl. ........................................................ 439/152
[58] Field of Search ............................ 439/152–153, 439/157, 159, 160

[56] References Cited

U.S. PATENT DOCUMENTS

| | | | |
|---|---|---|---|
| 3,271,626 | 9/1966 | Howrilka | 439/152 |
| 3,767,974 | 10/1973 | Donovan, Jr. et al. | 439/153 |
| 4,301,494 | 11/1981 | Jordan | 361/415 |
| 4,445,740 | 5/1984 | Wallace | 439/152 |
| 4,447,101 | 5/1984 | Gugliotti | 439/153 |
| 4,469,388 | 9/1984 | Narozny | 439/153 |

FOREIGN PATENT DOCUMENTS

| | | |
|---|---|---|
| 167667 | 11/1984 | European Pat. Off. . |
| 0176676 | 7/1985 | European Pat. Off. . |
| 8620241 | 7/1986 | Fed. Rep. of Germany . |

OTHER PUBLICATIONS

G. J. Clair, "Lever Secured Pluggable Circuit Card Enclosure", 11/84, IBM TDB, vol. 27, No. 6, pp. 3536–3538.

Primary Examiner—Joseph H. McGlynn

[57] ABSTRACT

A machine-pluggable electronic package for sliding engagement into a machine having a first electrical connector and first and second locking means. The package comprises a first electrical connector, a second electrical connector positioned on the package so that the second electrical connector can be connected to a connector outside of the machine and a lever. The lever has first and second locking means and is pivotably mounted on the package so that when the lever is moved in a first direction the first locking means of the lever engages the first locking means of the machine and locks the package in the machine and engages the first electrical connector of the package with the first electrical connector of the machine. When the lever is moved in a second direction the second locking means of the lever engages the second locking means of the machine and disengages the first electrical connector of the package from the first electrical connector of the machine and unlocks the package from the machine.

7 Claims, 5 Drawing Sheets

MACHINE-PLUGGABLE ELECTRONIC PACKAGE HAVING A MECHANICAL INTERLOCK

FIELD OF THE INVENTION

The present invention relates to machine electrical connection and more particularly relates to a device for facilitating the connection and the locking of a package, including electronic components, to a machine.

BACKGROUND OF THE INVENTION

The prior art is replete with devices facilitating the electrical connection of a package or a circuit card to a base machine. A typical example of such a device is shown in an article by G. J. Clair in IBM Technical disclosure bulletin (Vol. 27 No. 6 November 1984, pages 3536-3538), which discloses an enclosure designed to carry a circuit card and to provide easily applied force for plugging, unplugging and securing the card in place by simple lever action and without the use of any tool.

The prior art also discloses electrical interlocks to prevent the removal of the cover of a machine without turning off the power and unplugging the device from the power source, notably a wall socket etc. EP-A-176676 discloses an electrical interlock which insures that the power cord is removed from the machine before a functional package, containing electronic components, can be removed or inserted into the machine.

However, the prior art does not disclose a simple device which both allows an easy plugging and unplugging of a functional package containing electronic components, and requires that any electrical conductor, such as a power cord or a telecommunication cable, be removed from the machine before the functional package can be removed or inserted in the machine.

SUMMARY OF THE INVENTION

It is an object of the invention to provide means facilitating the insertion and the removal of a functional package containing electronic components in an electronic machine.

It is another object of the invention to provide a simple device for locking the functional package into the electronic machine.

It is a further object of the invention to provide a simple device insuring that an electrical conductor, such as a power cord or telecommunication cable, is removed from the machine before the functional package can be removed or inserted into the machine.

In accordance with the present invention, there is provided a machine-pluggable electronic package for sliding engagement into a machine having a first electrical connector and first and second locking means. The package comprises a first electrical connector, a second electrical connector positioned on the package so that the second electrical connector can be connected to a connector outside of the machine and a lever. The lever has first and second locking means and is pivotably mounted on the package so that when the lever is moved in a first direction the first locking means of the lever engages the first locking means of the machine and locks the package in the machine and engages the first electrical connector of the package with the first electrical connector of the machine. When the lever is moved in a second direction the second locking means of the lever engages the second locking means of the machine and disengages the first electrical connector of the package from the first electrical connector of the machine and unlocks the package from the machine.

The lever extends adjacent to the second electrical connector so that when such connector is connected to the connector outside of the machine, the lever cannot be moved to disengage the package.

Other objectives, advantages and applications of the present invention will be made apparent by the following detailed description of the preferred embodiment of the invention.

DETAILED DESCRIPTION OF THE INVENTION

To face with the increasing need of customers in highly sophisticated technology, while assuring a good deal of profit generated by mass production, electronic suppliers have a tendency to provide products in large quantities which products are nevertheless likely to satisfy numerous different requirements. For instance, in the field of telecommunication products, the concept of Integrated Services Digital Networks (I.S.D.N.), resulting from the on-going process of digitalization of telephone networks, which process started in the early sixties, will provide in every customer's home the possibility of connection to the future network and thus will allow the customer to access large public telecommunications services. Therefore, telecommunication suppliers will have to market in large quantities, adapters designed to allow the I.S.D.N network connection for large quantities of telecommunication Data Terminal Equipment (DTE) having different protocols and standards, such as V24, V35 or X21 standards as defined by the CCITT. Telecommunication product suppliers will therefore have to provide modular equipment, or functional packages, containing electronic components specific to particular protocols, and which when plugged into a base machine will allow the connection of a particular Data Terminal Equipment (for instance V35), to the I.S.D.N network. Since such products are marketed in large quantities and are intended to be used by general public, a need has appeared for a simple and low-cost device allowing an user to easily insert and remove a functional package or a circuit card, while assuring a good protection of the electronic components inside the package against hot plugging or unplugging as well as the protection of the user against electrical shocks.

Figure 1:
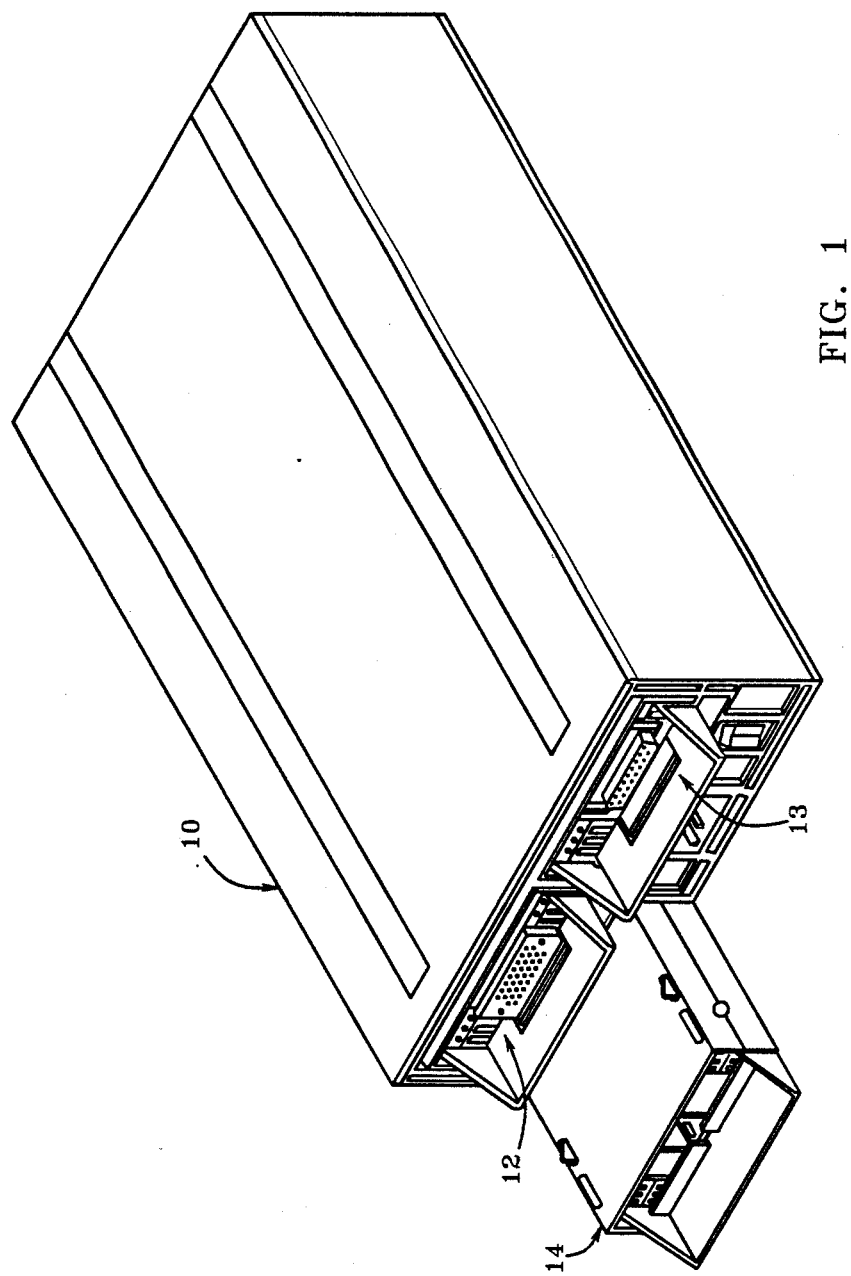
FIG. 1 is a perspective view of a base machine adapted to receive the machine-pluggable electronic package of the invention.
Figure 2A:
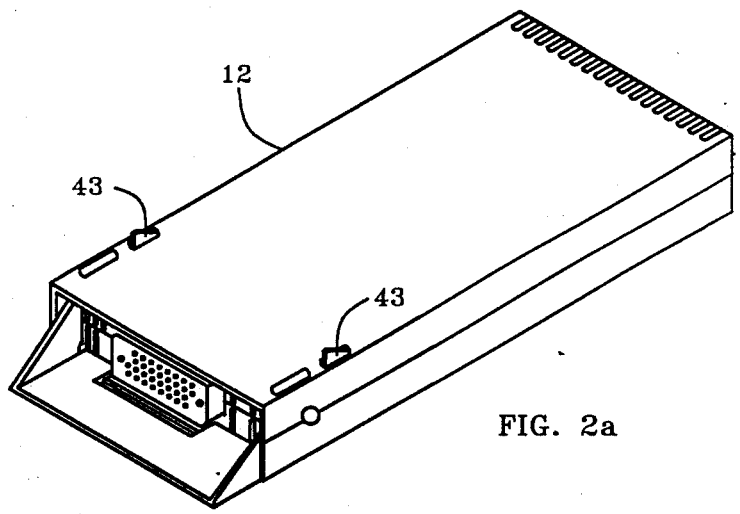
FIG. 2a and 2b are two perspective views of the functional package of the invention showing respectively the front and the rear side.
Figure 2B:
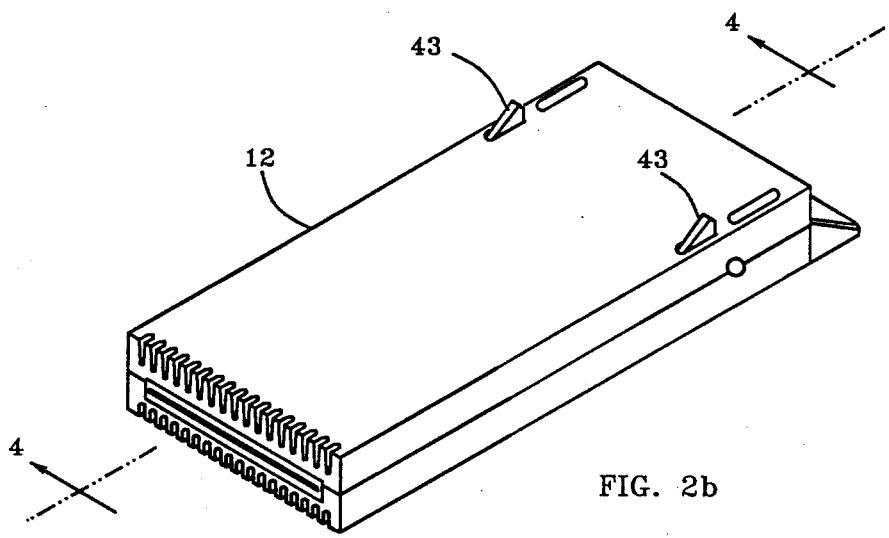
Figure 5:
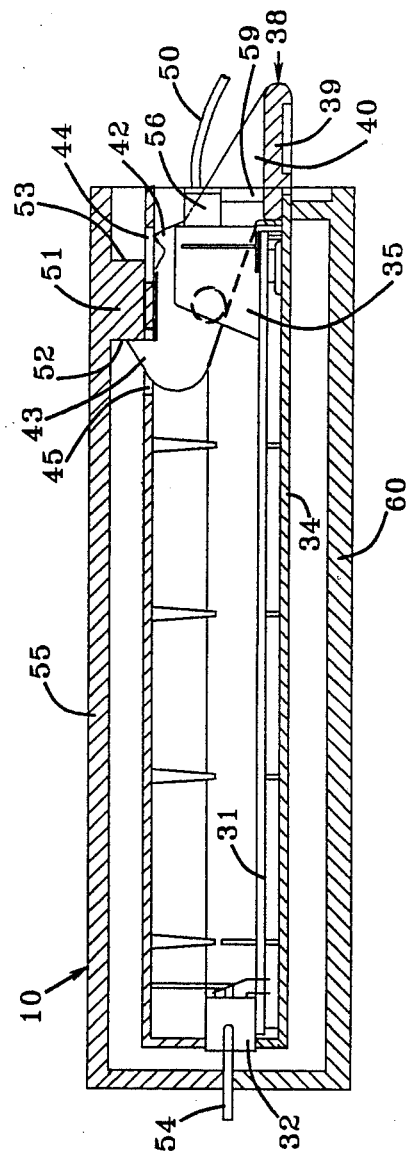
FIG. 5 is a longitudinal sectional view of the functional package inside the recess of the cavity of the base machine.

Referring now to the drawings, and particularly FIG. 1, a machine, in the illustrated instance a telecommunication adapter designed to be connected to a digital network, is illustrated therein. As shown, the machine or I.S.D.N. adapter 10 has its rear side, cavities or recesses in which functional packages 12, 13 and 14 can be housed. In an exemplary embodiment of the invention, each of functional packages 12 and 13 may contain electronic components mounted on a printed circuit board and allowing the connection of the machine 10 to a Data Terminal Equipment (DTE), not shown, by means of cable 50, as illustrated in FIG. 5. Functional package 14 contains electronic components allowing the connection of the machine to a digital network. Two perspective views of a typical functional package are shown in FIGS. 2a and 2b.

Figure 3:
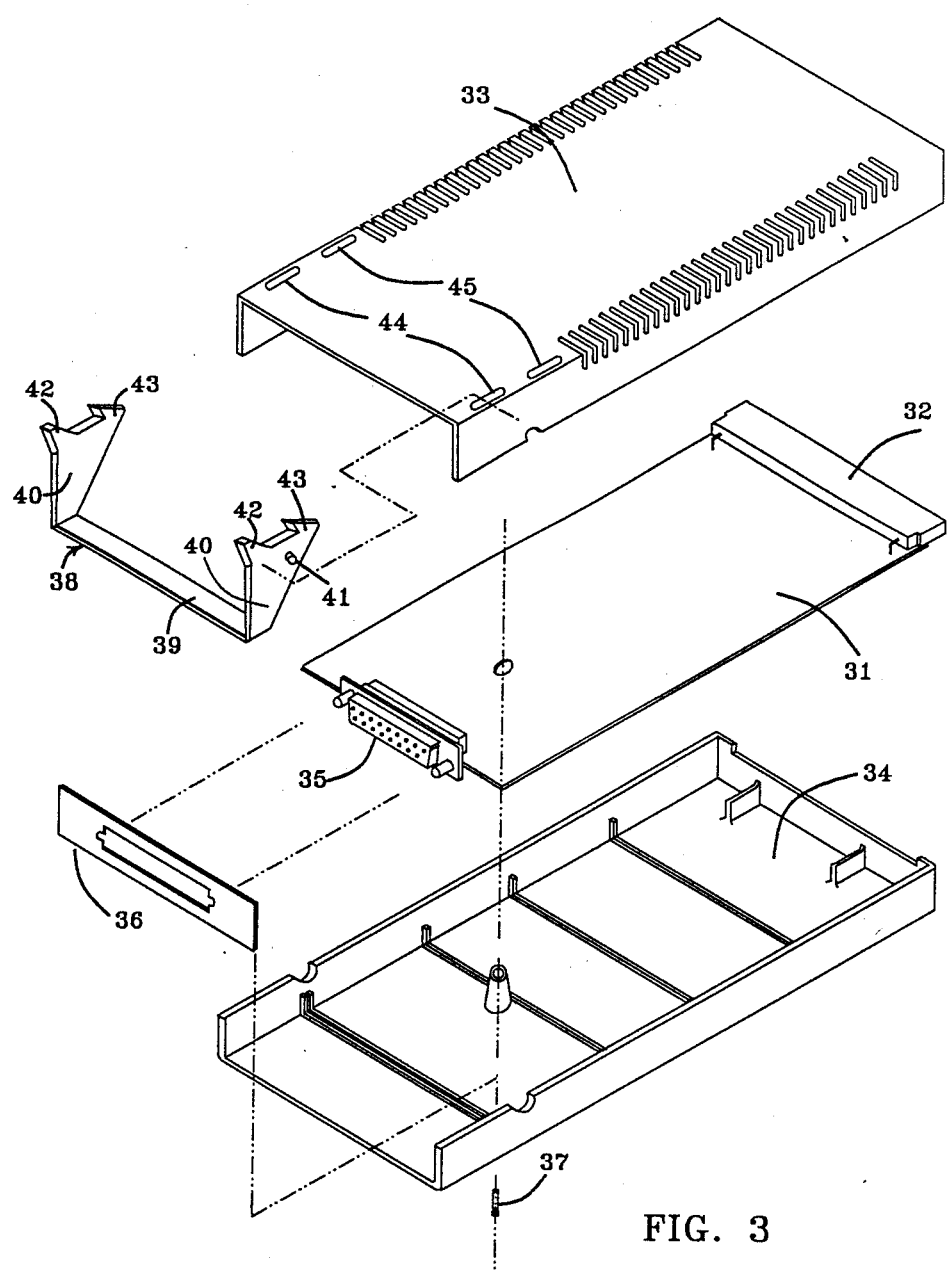
FIG. 3 is an exploded view of the different elements of the functional package according to the invention.

As shown in FIG. 3, each of functional packages 12, 13 or 14 includes a printed circuit board 31 on which are mounted electronic components. A first connector 32, adapted to pluggably receive a male connector 54 (see FIG. 5) secured to the base machine 10, is fixed to board 31, and allows the connection of the electronic components in the functional package to the components in machine 10. In an exemplary embodiment of the invention, the printed circuit board 31 is protected by a housing comprising a top cover 33 and a bottom cover 34 which are fixed together as by a screw 37. The printed circuit board 31 further includes a second connector 35, designed to connect the functional package to an outside equipment by means of cable 50. As will be understood by those skilled in the art, the nature of the components mounted on the printed circuit board 31, will determine the functional characteristics of the corresponding functional package and, hence, the type of equipment with which that package will be capable to be connected. A front plate 36 protects the rear side of the functional pack.

In accordance with the invention, each of the functional packages 12, 13 or 14 may be plugged into and removed from its associated cavity within machine 10 by means of a lever 38. As discussed in detail hereinafter, lever 38 is structured so that the magnitude of the force to be exerted by an operator to insert or remove the functional package is a small fraction of the magnitude of the force required to plug or unplug connectors 32 and 54. Without such an arrangement, the operator would have to exert a force of about 20 Newtons to connect or disconnect the package.

Lever 38 comprises a handle 39 designed to be operator grippable and, as shown in FIG. 3, two upwardly extending side arms 40, each connected at a first end thereof to handle 39. Each arm 40 carries a laterally extending pivot stud 41 and is provided at its second end with two upwardly projecting tooth elements 42, 43. Each pivot stud 41 is received in and cooperates with a pivot aperture formed in the longitudinally extending side of the functional package housing. Preferably, each pivot aperture is obtained by machining, within the top and bottom covers, two semi-circular notches which, upon assembling the top and bottom covers together, will form a single circular aperture for receiving pivot stud 41.

Figure 4:
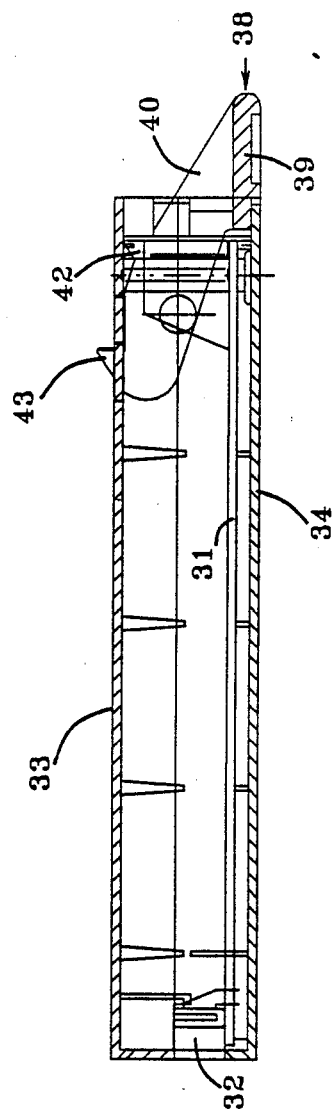
FIG. 4 is a cross sectional view of the functional package according to the invention taken along line 4—4 in FIG. 2b.

Each tooth element 42, 43 is positioned with respect to its associated arm 40 and stud 41 so that, upon clockwise rotation (as shown in FIG. 4) of lever 38 around studs 41, it will penetrate into an associated elongated aperture 45 formed within the top face of top cover 33, while during the same clockwise rotation, tooth element 42 will leave its associated aperture 44.

As best shown in FIG. 5, the handle portion 39 of lever 38 is located with respect to connector 35 so that the presence of a connector plugged into connector 35 will prevent the lever 38 from being rotated counterclockwise as shown in FIG. 5. It should be noted that counterclockwise rotation brings the handle of the lever 38 to its upper position. For some type of small connectors 35, it may be necessary to provide handle portion 39 with a supplementary upwardly extending protrusion part 59 which, by engaging the connector body, will prevent the rotation of handle portion 39, while not preventing plugging and unplugging of the connector 56 and its cable 50.

FIG. 5 also shows that the cavity of machine 10 in which functional package 12, 13, 14 is received, is delimited by at least an upper wall 55 and a lower wall 60. Extending from upper and lower wall 55 and 60 are package guiding means which can take the form of channel means in which package 12, 13 or 14 can be slidably inserted. It should be understood that such channel means must be sized with respect to the dimensions of package 12, 13 or 14 so that they will permit only a longitudinal movement of the package within its cavity. Upper wall 55 is provided with a downward extending rail element 51. Rail element 51 extends transversely to the functional package guiding means. The height of rail 51 is such that both its edges 52 and 53 interfere with tooth element 42, 43 of lever 38, unless the latter has been rotated to positions where the tooth elements 42, 43 will have cleared the edges of rail 51.

Referring to FIG. 5, the operation of the device will now be described. The package is inserted into its associated cavity of machine 10 with lever 38 in its upper position, until tooth element 42 of lever 38 engages edge 53, at which time any further insertion of the package is prevented. At this point, lever 38 is rotated to its lower position as illustrated in FIG. 5. During that rotation, tooth element 43 first engages the lower corner of edge portion 52 of rail 51. Any further rotation of lever 38 will forcibly engage tooth element 42 with edge 52 and will create a torque which, in turn, will generate a longitudinal force. This force will further move the functional package within its associated cavity and will result in the plugging of connectors 32 and 54. Conversely, the removal of the package is achieved by rotating lever 38 towards its upper position. The engagement of element 42 with rail edge 53 will generate a torque which will assist in the extraction of the package from the machine 10 without requiring any substantial effort on the part of the operator.

When connector 54 is plugged into connector 32, a connector 56 may be plugged into connector 35 of functional package 14, assuring the connection of the machine to the digital network by means of a cable 50. However, the insertion or extraction of this package in or out of the machine, when the cable 50 is plugged, may cause the occurrence of voltage spikes due to excessive momentary loads. This may damage or destroy some internal components of the machine, or worst of all, badly injure the user. This problem is solved in the present invention by the presence of a protrusion 59, which prevents, as long as connector 56 remains plugged, the rotation of lever 38, and hence, the extraction of the functional package. Similarly, due to protrusion 59, the insertion of the package into the base machine can only be performed when male connector 56 is not plugged in its corresponding female connector plug 35. It should be understood that connector 56 and its cable 50 must be disconnected from the functional package 14 before same can be removed or inserted into the machine.

It is to be understood that variations and modifications of the present invention can be made without departing from the scope of the invention. It is also to be understood that the scope of the invention is not to be interpreted as limited to the specific embodiments disclosed herein, but only in accordance with the appended claims when read in light of the foregoing disclosure.

We claim:

1. An electronic package adapted to be connected to a machine and to an external connector, said machine having a cavity therein for receiving said package, a first electrical connector for connection to said package, and first and second locking means extending into said cavity, said first electrical connector being located at one end of said cavity, said package comprising:

a housing of a shape adapted to fit into said cavity;

a printed circuit board mounted within said housing and having electronic components thereon;

a second electrical connector mounted at one end of said housing and being connected to said printed circuit board, said second electrical connector being adapted to mate with said first electrical connector upon said package being inserted into said cavity;

a third electrical connector mounted on said housing at another end thereof and being adapted to mate with said external electrical connector to establish an electrical connection between said package and equipment outside said machine;

and a lever mounted on said housing and being movable between first and second positions, said lever having first and second lever locking means, and first lever locking means being adapted to engage said first locking means on said machine and move said package in said cavity so as to engage said first and second electrical connectors upon movement of said lever from said first position to sid second position, said first lever locking means being operative to prevent sid package from being removed from said machine while said lever is in said second position, said second lever locking means being adapted to engage said second locking means on said machine upon movement of said lever from said second position to said first position and disengage said first and second electrical connectors, said lever having a portion located adjacent to said third electrical connector when sid lever is in said second position which portion is adapted to engage said external connector and prevent said lever from being moved from said second position when said third electrical connector is connected to said external connector, and thereby prevent said package from being removed from said machine without first disengaging said external connector.

2. A package in accordance with claim 1, wherein said lever comprises: a side arm having said first and second lever locking means and a pivot stud; and wherein said housing comprises a first partial cover having a notch and a second partial cover having a notch positioned so that when said first partial cover and said second partial cover are assembled said notch in said first partial cover and said notch in said second partial cover for an aperture for receiving said pivot stud.

3. A package in accordance with claim 2, wherein said first lever locking means is a first tooth element and sid second lever locking means is a second tooth element, and wherein one of said first and second partial covers comprises first and second aperture positioned so that when said lever is moved in a first direction said first tooth element extends through said first aperture and when said lever is moved in a second direction said first tooth element is withdrawn from said first aperture and said second tooth element is inserted through said second aperture.

4. A package in accordance with claim 3, wherein said first and second tooth elements extend through said first and second apertures to respectively engage said first and second locking means on said machine.

5. A package in accordance with claim 1 wherein said lever is generally U shaped and has a handle extending across said another end of said housing adjacent to said third connector and two side arms pivotally mounted on sides of said housing, said first and second lever locking means being located on said side arms.

6. A package in accordance with claim 5 wherein said housing is elongated and is adapted to cooperate with guides on said machine so that said package can be slid into said cavity, said lever being operative upon rotation thereof between said first and second positions to translate such rotation into linear movement of said package into and out of said cavity.

7. A package in accordance with claim 5 wherein said portion of said lever comprises a protrusion on said handle, said protrusion being adapted to engage said external connector.

* * * * *